US011683899B2

(12) United States Patent
Lu et al.

(10) Patent No.: US 11,683,899 B2
(45) Date of Patent: Jun. 20, 2023

(54) WATERPROOF DEVICE

(71) Applicant: WISTRON NEWEB CORPORATION, Hsinchu (TW)

(72) Inventors: Man-Ning Lu, Hsinchu (TW); Bing-Chun Chung, Hsinchu (TW); Ming-Hung Hung, Hsinchu (TW); Yi-Chieh Lin, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 221 days.

(21) Appl. No.: 17/358,060

(22) Filed: Jun. 25, 2021

(65) Prior Publication Data

US 2022/0124928 A1    Apr. 21, 2022

(30) Foreign Application Priority Data

Oct. 15, 2020  (TW) .................................. 109135762

(51) Int. Cl.
*H05K 5/06* (2006.01)
*B65D 53/00* (2006.01)

(52) U.S. Cl.
CPC ............ *H05K 5/061* (2013.01); *B65D 53/00* (2013.01)

(58) Field of Classification Search
CPC ................................ H05K 5/061; B65D 53/00
USPC ................................................. 220/378, 324
See application file for complete search history.

(56) References Cited

U.S. PATENT DOCUMENTS

| 5,193,706 A * | 3/1993 | Hanna ...................... B25H 3/02 220/756 |
| 5,875,916 A * | 3/1999 | Crockett, Sr. .......... B65D 25/14 206/811 |
| 6,217,835 B1 * | 4/2001 | Riley ........................ A61L 2/26 206/1.5 |
| 8,297,464 B2 * | 10/2012 | Grenier ................... E05B 65/52 220/314 |
| 8,496,133 B2 * | 7/2013 | Mizukoshi ........ H01L 21/67383 220/322 |
| 2002/0162841 A1 * | 11/2002 | Shamir ..................... A61L 2/26 220/326 |
| 2005/0139599 A1 * | 6/2005 | Schainholz ............... A61L 2/28 422/295 |
| 2006/0049640 A1 * | 3/2006 | Lee .......................... B25H 3/02 292/80 |

(Continued)

*Primary Examiner* — J. Gregory Pickett
*Assistant Examiner* — Niki M Eloshway
(74) *Attorney, Agent, or Firm* — McClure, Qualey & Rodack, LLP

(57) ABSTRACT

A waterproof device including a casing structure, a cover structure, a first engaging plate, a second engaging plate, a first elastic member, and a second elastic member is provided. The casing structure, on which the cover structure is disposed, includes a bottom plate, a first side plate, a second side plate, a third side plate, and a fourth side plate. The first engaging plate is disposed adjacent to the first side plate, and the first elastic member is connected therebetween. The second engaging plate is disposed adjacent to the second side plate, and the second elastic member is connected therebetween. The first engaging plate can reciprocate between a first positioning position and a first disengagement position relative to the first side plate, and the second engaging plate can reciprocate between a second positioning position and a second disengagement position relative to the second side plate.

10 Claims, 14 Drawing Sheets

(56) References Cited

U.S. PATENT DOCUMENTS

| | | | | |
|---|---|---|---|---|
| 2012/0205380 A1* | 8/2012 | Rekasch | ............... | B61D 17/16 |
| | | | | 220/324 |
| 2012/0292312 A1* | 11/2012 | Chang | ...................... | B42F 7/14 |
| | | | | 220/4.24 |
| 2013/0043250 A1* | 2/2013 | Kreidler | ................... | A61L 2/26 |
| | | | | 292/286 |
| 2022/0411166 A1* | 12/2022 | Mudd | ............... | B65D 81/3823 |

* cited by examiner

WATERPROOF DEVICE

CROSS-REFERENCE TO RELATED PATENT APPLICATION

This application claims the benefit of priority to Taiwan Patent Application No. 109135762, filed on Oct. 15, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a waterproof device, and more particularly to a waterproof device that blocks liquid from entering inside.

BACKGROUND OF THE DISCLOSURE

Firstly, due to signal characteristics of the $5^{th}$ Generation Mobile Networks (5G) technology, a millimeter wave (mm-Wave) thereof has a higher directivity and a shorter wavelength so that signals cover a smaller angle of transmission and have a weaker penetration. In addition, most conventional signal receiving products are located indoors, where the conventional signal receiving products are usually unable to effectively receive signals.

Moreover, the conventional signal receiving products can also be arranged outdoors, so as to enhance a signal strength thereof; however, the conventional signal receiving products that are arranged outdoor are oftentimes damaged due to moisture entering into the conventional signal receiving products.

Therefore, it has become an important issue in the industry to provide a waterproof device for configuring signal receiving products therein, so as to provide a waterproof function to overcome the above inadequacies.

SUMMARY OF THE DISCLOSURE

In response to the above-referenced technical inadequacies, the present disclosure provides a waterproof device.

In one aspect, the present disclosure provides a waterproof device including a casing structure, a cover structure, a first engaging plate, a second engaging plate, a first elastic member, and a second elastic member. The casing structure includes a bottom plate, and a first side plate, a second side plate, a third side plate, and a fourth side plate surrounding a periphery of the bottom plate and connected to the bottom plate. The third side plate is connected between the first side plate and the second side plate, the fourth side plate is connected between the first side plate and the second side plate, and the bottom plate, the first side plate, the second side plate, the third side plate, and the fourth side plate surroundingly and jointly form an accommodating space. The cover structure is disposed on the casing structure and covers the accommodating space, and the cover structure abuts against the first side plate, the second side plate, the third side plate, and the fourth side plate. The cover structure includes a cover body, and a first abutting portion and a second abutting portion that are disposed on the cover body. The first engaging plate is disposed adjacent to the first side plate, and the first engaging plate includes a first plate body, a first fastening portion disposed on the first plate body, and a first retaining groove formed on the first plate body. The second engaging plate is disposed adjacent to the second side plate and corresponding to the first engaging plate, the second engaging plate includes a second plate body, a second fastening portion disposed on the second plate body, and a second retaining groove formed on the second plate body. The first elastic member is connected between the first side plate and the first engaging plate, the first elastic member includes a first pivot portion, a second pivot portion, and a first connecting portion connected between the first pivot portion and the second pivot portion. The first pivot portion is disposed in a first pivot seat on the first side plate, and the second pivot portion is disposed in the first retaining groove of the first engaging plate. The first pivot portion is rotatable relative to the first pivot seat, and the second pivot portion is rotatable relative to the first retaining groove. The second elastic member is connected between the second side plate and the second engaging plate, the second elastic member includes a third pivot portion, a fourth pivot portion, and a second connecting portion connected between the third pivot portion and the fourth pivot portion. The third pivot portion is disposed in a second pivot seat on the second side plate, and the fourth pivot portion is disposed in the second retaining groove of the second engaging plate. The third pivot portion is rotatable relative to the second pivot seat, and the fourth pivot portion is rotatable relative to the second retaining groove. The first engaging plate is capable of reciprocating between a first positioning position and a first disengagement position relative to the first side plate, and the second engaging plate is capable of reciprocating between a second positioning position and a second disengagement position relative to the second side plate. When the first engaging plate is positioned on the first positioning position, the first fastening portion is fastened on the first abutting portion. When the second engaging plate is positioned on the second positioning position, the second fastening portion is fastened on the second abutting portion.

One of the beneficial effects of the waterproof device provided by the present disclosure is that, the waterproofing effect of the waterproof device can be enhanced through technical solutions of "the first engaging plate being capable of reciprocating between the first positioning position and the first disengagement position relative to the first side plate, and the second engaging plate being capable of reciprocating between the second positioning position and the second disengagement position relative to the second side plate" and "when the first engaging plate is positioned at the first positioning position, the first fastening portion being fastened on the first abutting portion, and when the second engaging plate is positioned at the second positioning position, the second fastening portion being fastened on the second abutting portion".

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following description and accompanying drawings, in which.

DETAILED DESCRIPTION OF THE EXEMPLARY EMBODIMENTS

Figure 1:
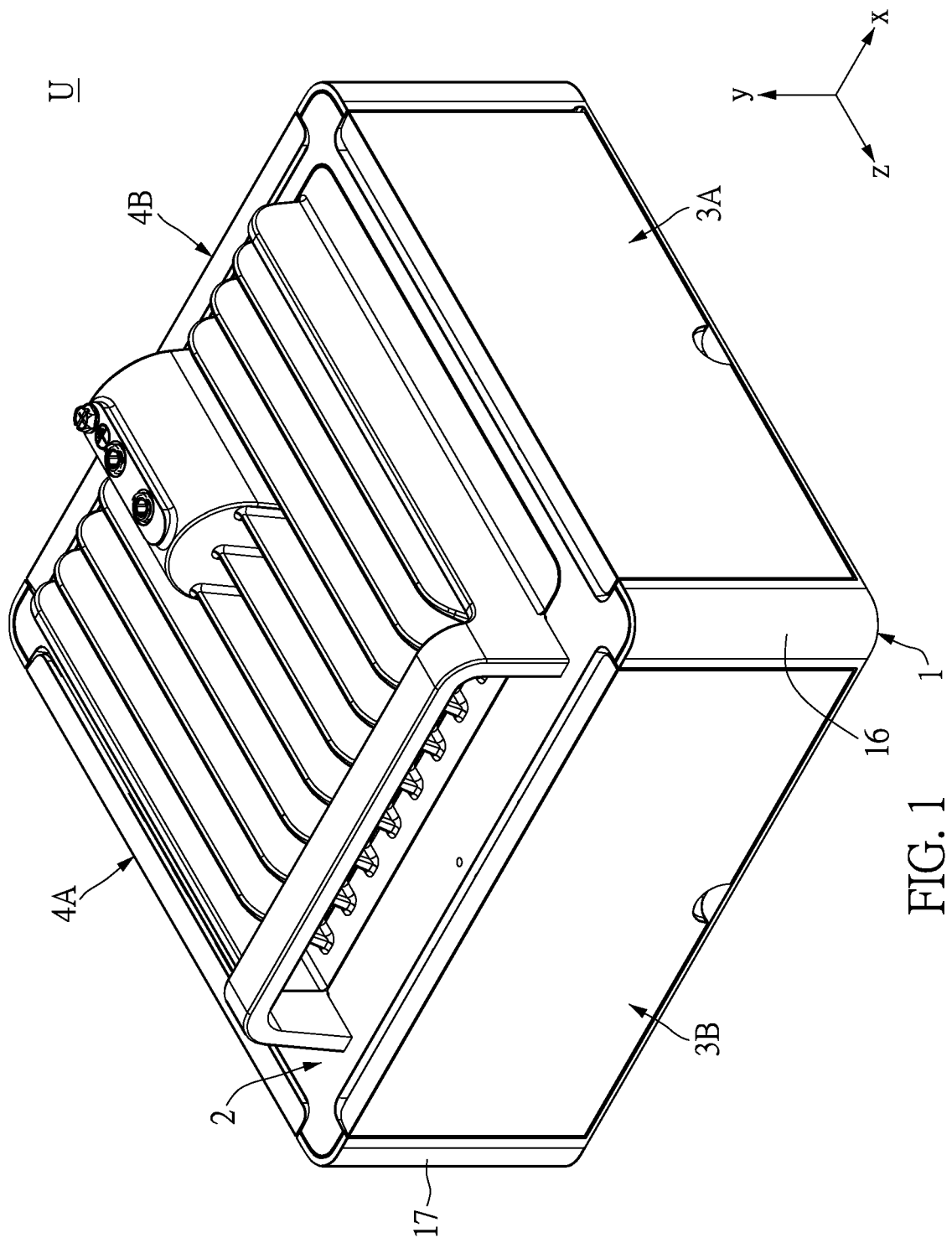
FIG. 1 is a schematic assembled perspective view of a waterproof device in one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Embodiment

Figure 2:
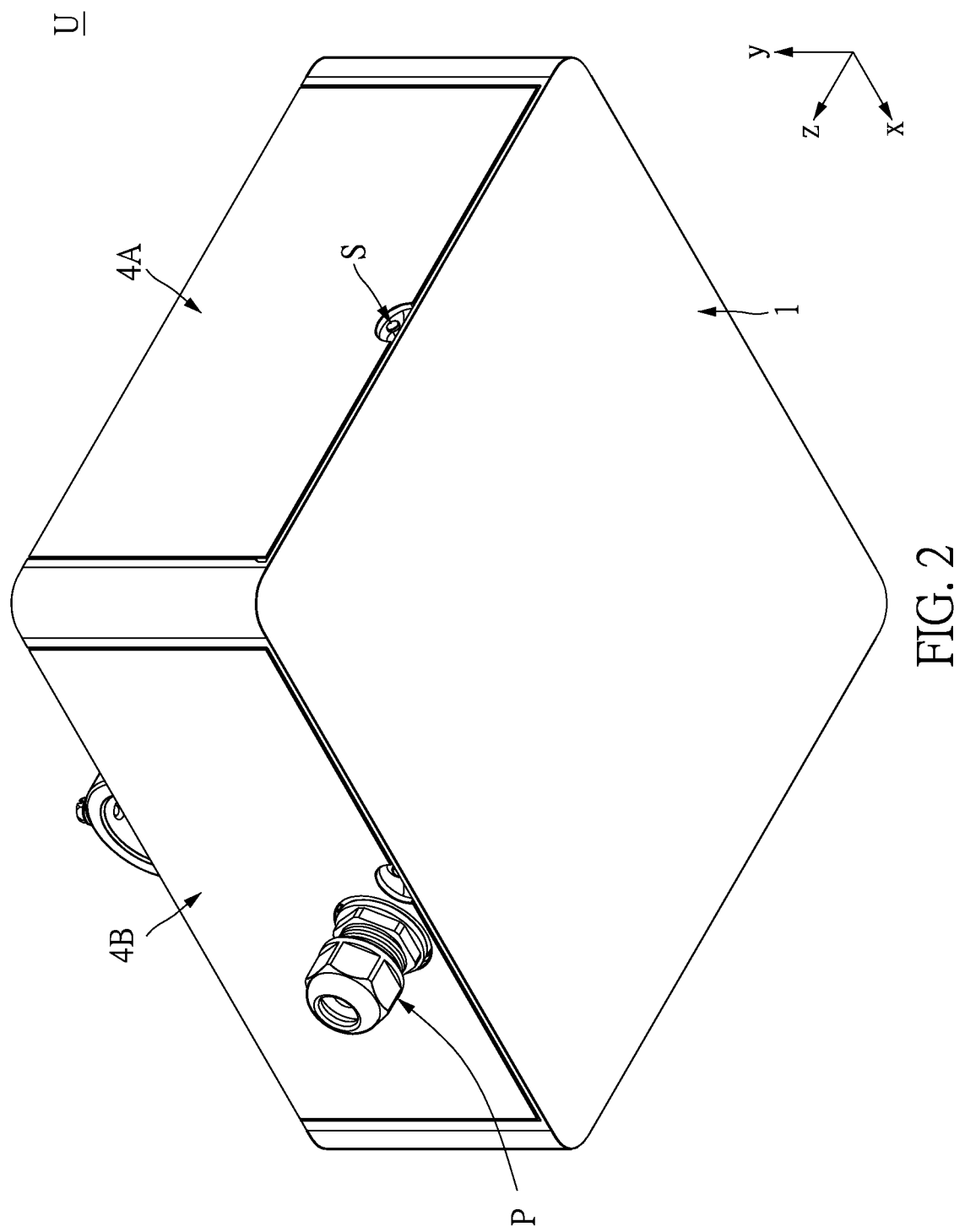
FIG. 2 is another schematic assembled perspective view of the waterproof device in one embodiment of the present disclosure.
Figure 3:
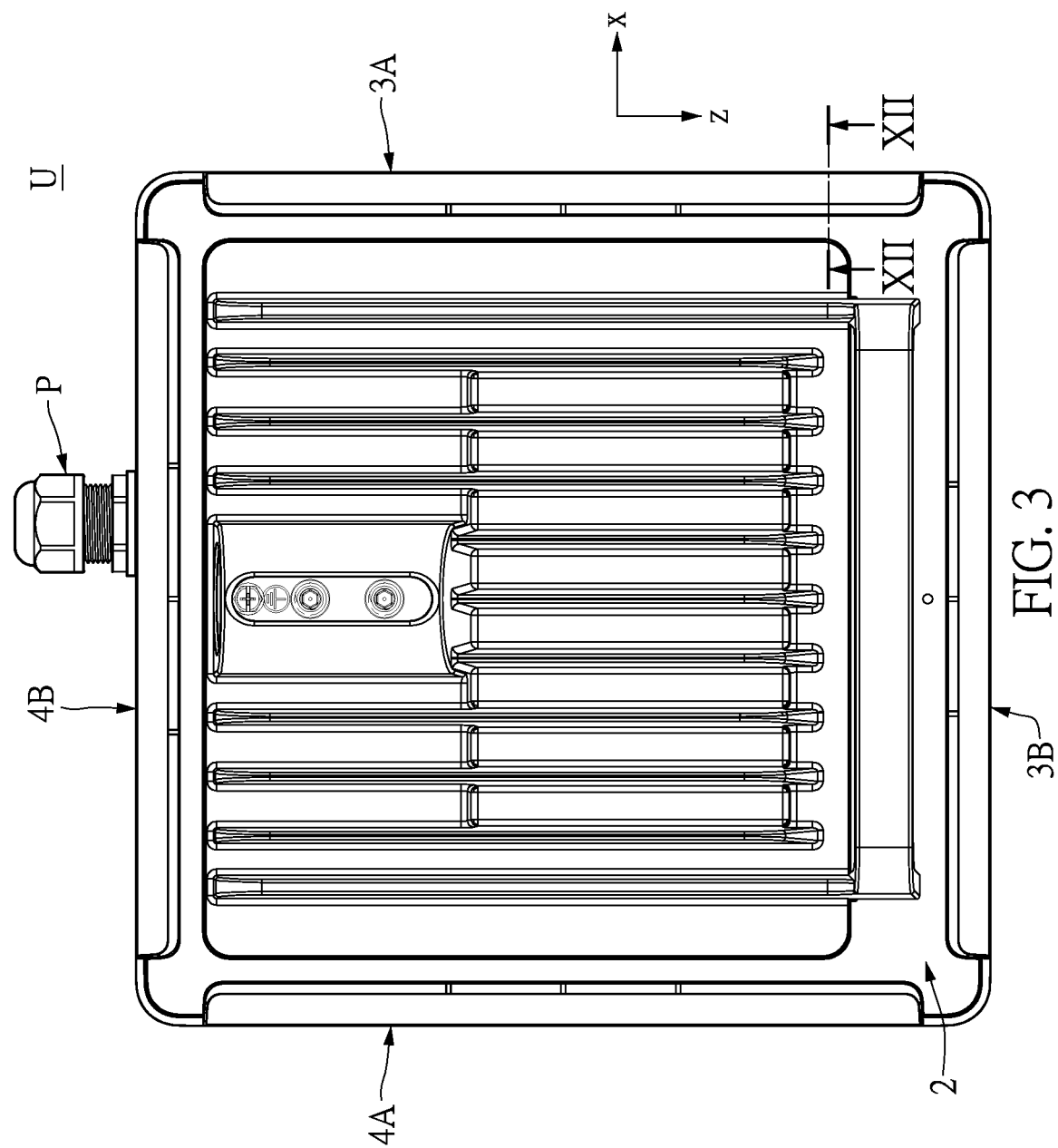
FIG. 3 is a schematic top view of the waterproof device in one embodiment of the present disclosure.

References are made to FIG. 1 to FIG. 3. FIG. 1 and FIG. 2 are schematic assembled perspective views of a waterproof device in one embodiment of the present disclosure. FIG. 3 is a schematic top view of the waterproof device in one embodiment of the present disclosure. A waterproof device U is provided in one embodiment of the present disclosure, which can be applied to a signal receiver (not shown in the figures). For example, a signal receiver that is conventionally used indoors can be arranged in the waterproof device U of the present disclosure, and the waterproof device U including the signal receiver can be further arranged outdoors to improve a signal transceiving effect. However, although the waterproof device U is exemplified as having the signal receiver arranged therein in the present disclosure, the waterproof device U can also be applied to other products that require waterproofing in other embodiments.

Figure 4:
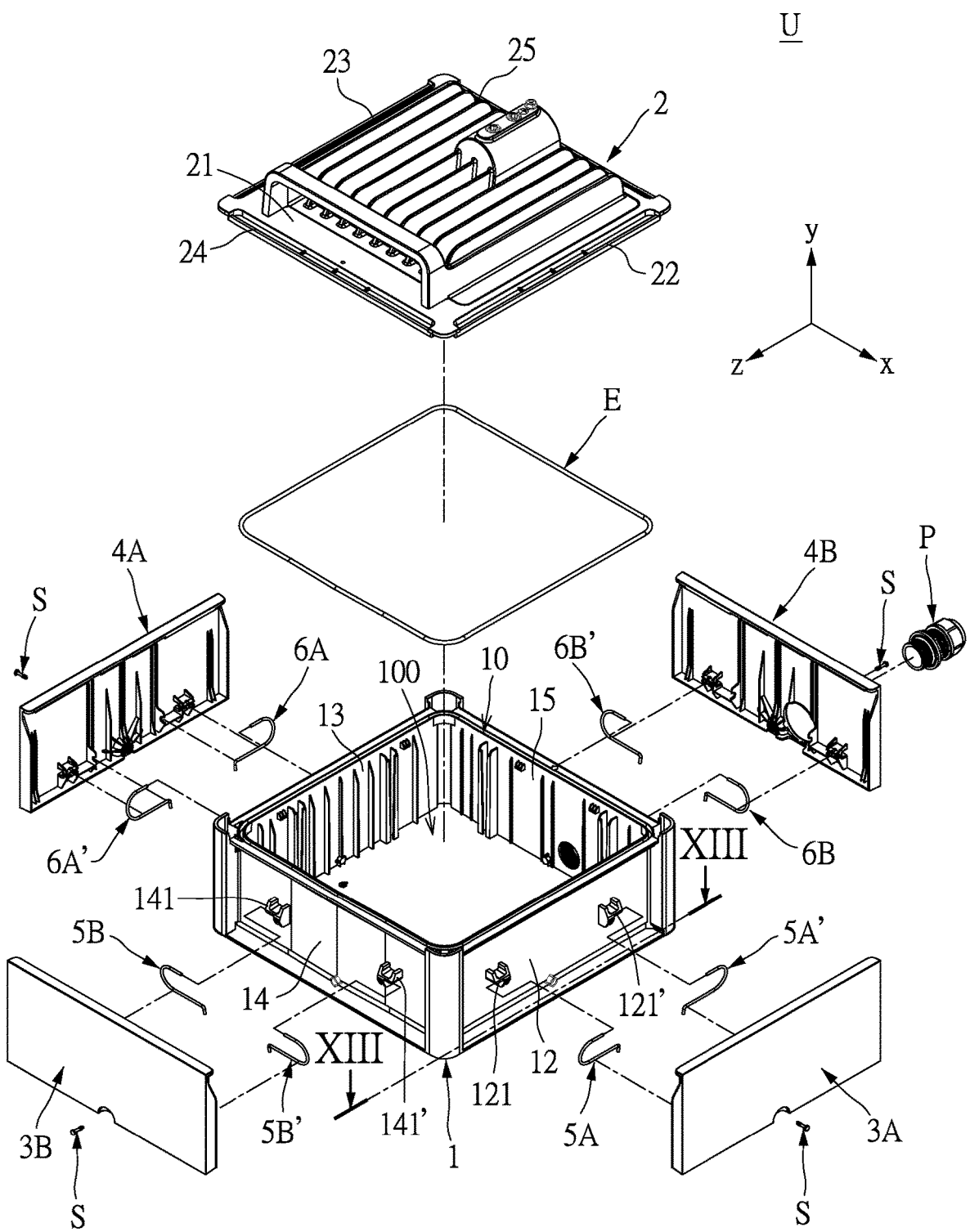
FIG. 4 is a schematic exploded perspective view of the waterproof device in one embodiment of the present disclosure.
Figure 5:
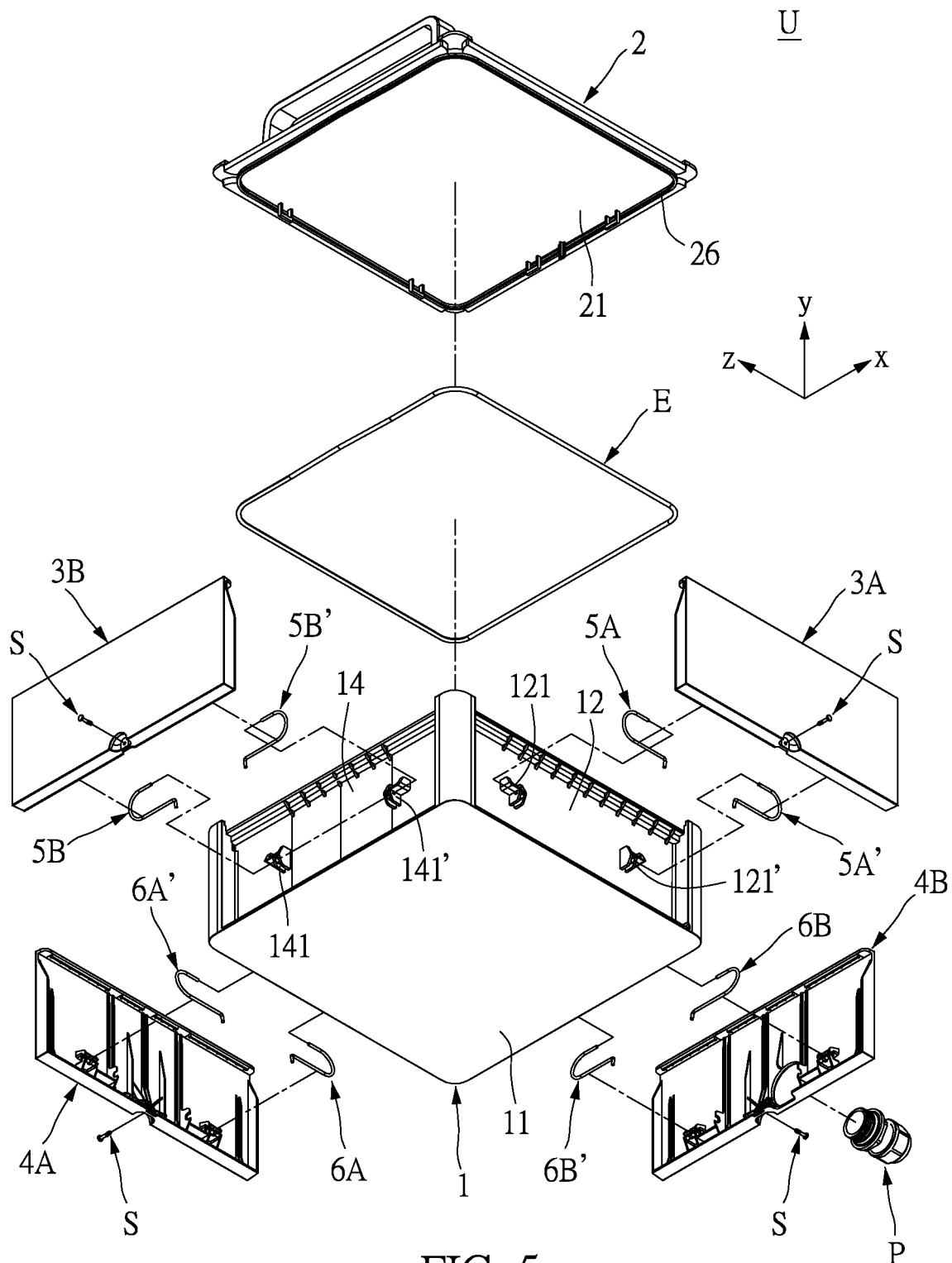
FIG. 5 is another schematic exploded perspective view of the waterproof device in one embodiment of the present disclosure.
Figure 6:
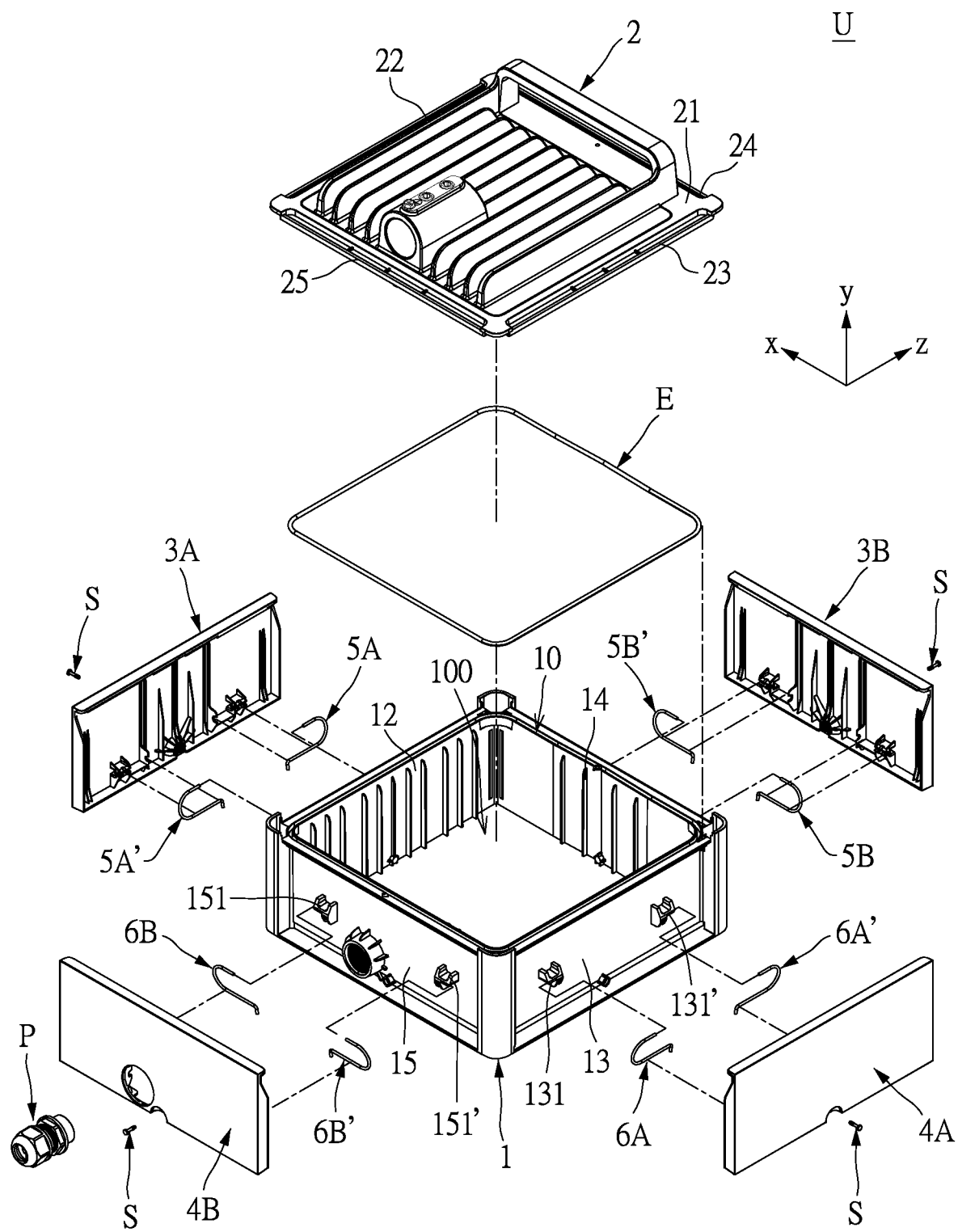
FIG. 6 is yet another schematic exploded perspective view of the waterproof device in one embodiment of the present disclosure.

References are further made to FIG. 1 to FIG. 3, and are to be read in conjunction with FIG. 4 to FIG. 6. FIG. 4 to FIG. 6 are respectively schematic exploded perspective views of the waterproof device in one embodiment of the present disclosure. The waterproof device U includes a casing structure 1, a cover structure 2, a first engaging plate 3A, a second engaging plate 4A, a first elastic member 5A, and a second elastic member 6A. The cover structure 2 is disposed on the casing structure 1 and shields an accommodating space 100 of the casing structure 1. The first engaging plate 3A and the second engaging plate 4A are disposed on two opposite sides of the casing structure 1. The first elastic member 5A is connected between the casing structure 1 and the first engaging plate 3A, and the second elastic member 6A is connected between the casing structure 1 and the second engaging plate 4A. The first engaging plate 3A and the second engaging plate 4A can fix the cover structure 2 on the casing structure 1 through elastic force provided by the first elastic member 5A and the second elastic member 6A.

The waterproof device U can further include a third engaging plate 3B, a fourth engaging plate 4B, a third elastic member 5B, and a fourth elastic member 6B. The third engaging plate 3B and the fourth engaging plate 4B are disposed on two opposite sides of the casing structure 1, the third elastic member 5B is connected between the casing structure 1 and the third engaging plate 3B, and the fourth elastic member 6B is connected between the casing structure 1 and the fourth engaging plate 4B, such that the third engaging plate 3B, the fourth engaging plate 4B, the third elastic member 5B, and the fourth elastic member 6B are further utilized to increase a bonding strength of the cover structure 2 and the casing structure 1.

References are further made to FIG. 1 to FIG. 6, the casing structure 1 includes a bottom plate 11, a first side plate 12 surrounding a periphery of the bottom plate 11 and connected to the bottom plate 11, a second side plate 13, a third side plate 14, and a fourth side plate 15. The third side plate 14 is connected between the first side plate 12 and the second side plate 13, and the fourth side plate 15 is connected between the first side plate 12 and the second side plate 13. The bottom plate 11, the first side plate 12, the second side plate 13, the third side plate 14, and the fourth side plate 15 jointly and surroundingly form an accommodating space 100. In addition, the cover structure 2 is disposed on the casing structure 1 and shields the accommodating space 100. The cover structure 2 abuts against the first side plate 12, the second side plate 13, the third side plate 14, and the fourth side plate 15. The cover structure 2 can include a cover body 21, a first abutting portion 22 disposed on the cover body 21, a second abutting portion 23 disposed on the cover body 21, a third abutting portion 24 disposed on the cover body 21, and a fourth abutting portion 25 disposed on the cover body 21. In this way, the signal receiver that is conventionally used indoors can be arranged in the accommodating space 100.

Figure 7:
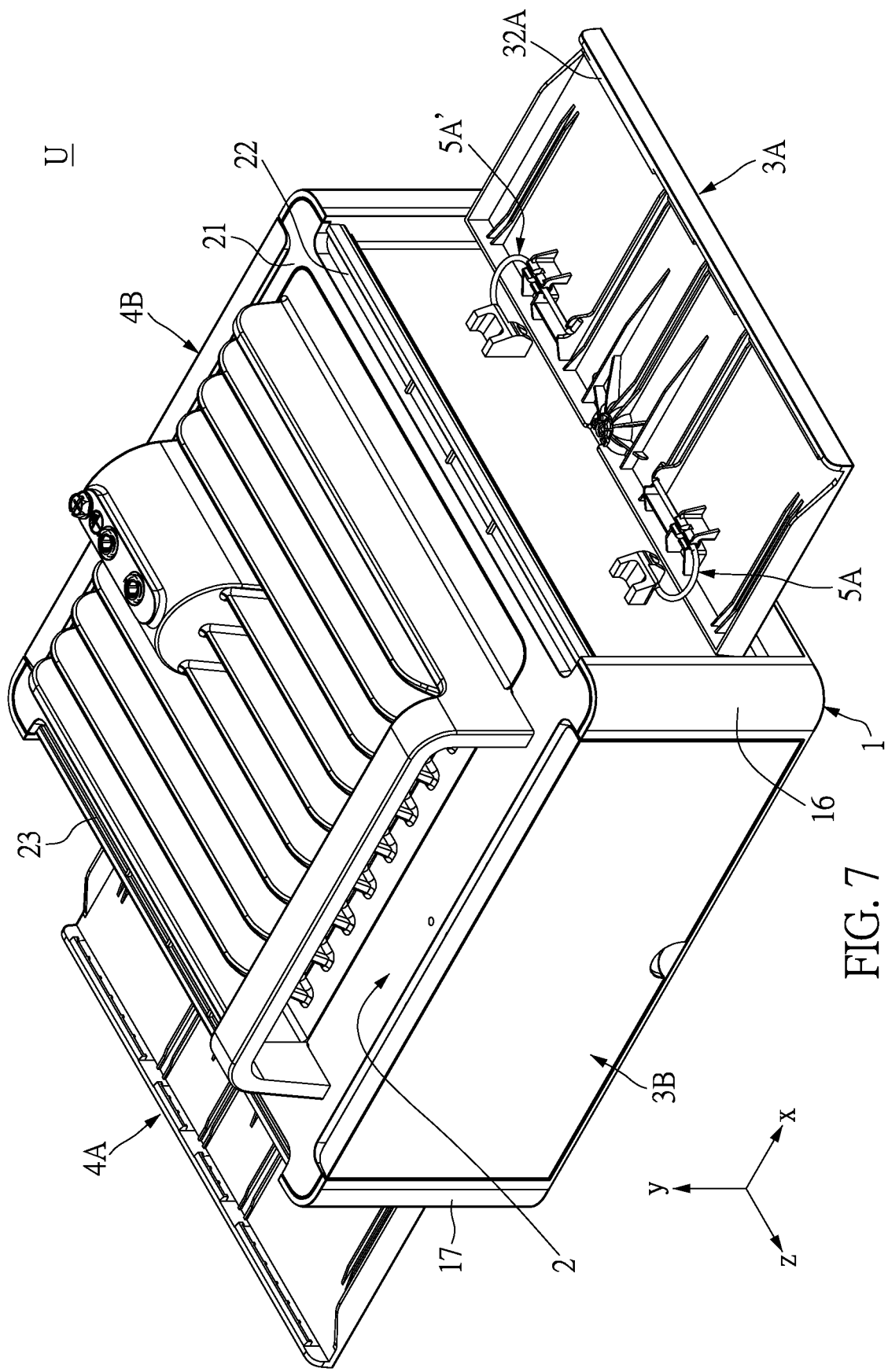
FIG. 7 is a schematic view showing the waterproof device in use in one embodiment of the present disclosure.
Figure 8:
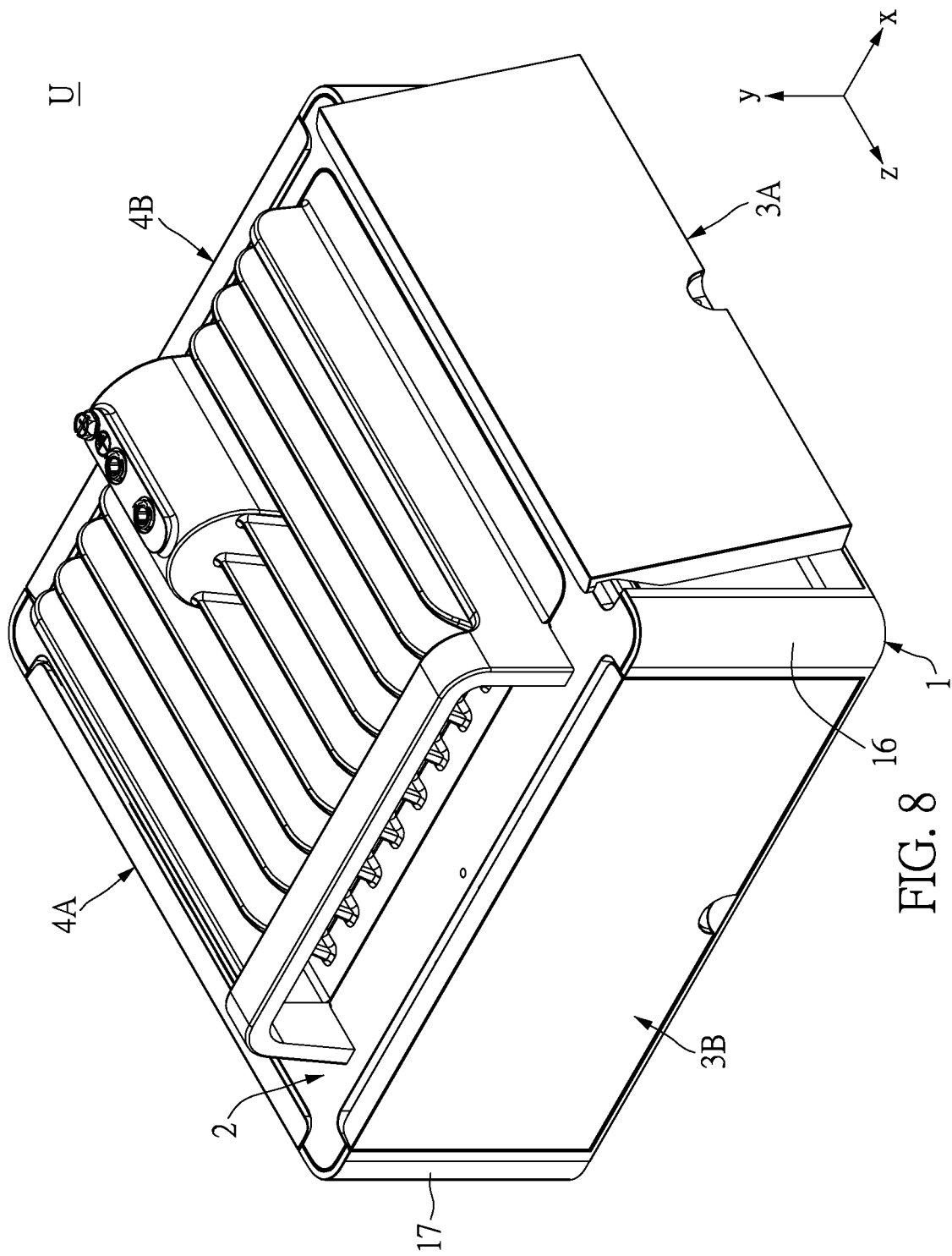
FIG. 8 is another schematic view showing the waterproof device in use in one embodiment of the present disclosure.

Referring to FIG. 7 and FIG. 8, FIG. 7 and FIG. 8 are schematic views showing the waterproof device in use in one embodiment of the present disclosure. The first engaging plate 3A can reciprocate between a first positioning position and a first disengagement position relative to the first side plate 12, and the second engaging plate 4A can reciprocate between a second positioning position and a second disengagement position relative to the second side plate 13. In addition, when the first engaging plate 3A is positioned at the first positioning position, a first fastening portion 32A of the first engaging plate 3A is fastened on the first abutting portion 22, and when the second engaging plate 4A is positioned at the second positioning position, a second fastening portion 42A of the second engaging plate 4A is fastened on the second abutting portion 23. That is to say, in the implementations shown in FIG. 1 and FIG. 2, a state of the first engaging plate 3A being positioned at the first positioning position and the second engaging plate 4A being positioned at the second positioning position is illustrated, and a state of the first engaging plate 3A being positioned at the first disengagement position and the second engaging plate 4A being positioned at the second disengagement position are illustrated in the implementations shown in FIG. 7 and FIG. 8.

In addition, the third engaging plate 3B can also reciprocate between a positioning position and a disengagement position relative to the third side plate 14, and the fourth engaging plate 4B can also reciprocate between another positioning position and another disengagement position relative to the fourth side plate 15, so as to open or close the cover structure 2. Therefore, when the third engaging plate 3B is positioned at the positioning position, a third fastening portion 32B of the third engaging plate 3B is fastened on the third abutting portion 24, and when the fourth engaging plate 4B is positioned at the another positioning position, a fourth fastening portion 42B of the fourth engaging plate 4B is fastened on the fourth abutting portion 25.

Preferably, the waterproof device U can further include a cushion ring E that can be, for example, but not limited to, a rubber cushion ring. The cushion ring E can be disposed between the casing structure 1 and the cover structure 2, and the cushion ring E surrounds the accommodating space 100. In addition, the cover structure 2 indirectly abuts against the first side plate 12, the second side plate 13, the third side plate 14, and the fourth side plate 15 through the cushion ring E, and the cushion ring E can abut against the casing structure 1 and the cover structure 2, so as to seal the accommodating space 100. That is to say, when the first engaging plate 3A is positioned at the first positioning position and the second engaging plate 4A is positioned at the second positioning position, the cushion ring E can abut against the casing structure 1 and the cover structure 2. In addition, the casing structure 1 can further include an accommodating groove 10 arranged on the first side plate 12, the second side plate 13, the third side plate 14, and the fourth side plate 15 and surrounding the accommodating space 100, and the cover structure 2 can further include a protruding rim 26 disposed on the cover body 21. The cushion ring E can be disposed in the accommodating groove 10 of the casing structure 1. When the first engaging plate 3A is positioned at the first positioning position and the second engaging plate 4A is positioned at the second positioning position, the protruding rim 26 of the cover structure 2 can be positioned in the accommodating groove 10 of the casing structure 1 and abut against the cushion ring E, such that a tightness of engagement between the casing structure 1 and the cover structure 2 can be increased by the cushion ring E.

Preferably, the waterproof device U can further include a plurality of securing members S, one of the securing members S can be disposed on the first engaging plate 3A and the first side plate 12, and another one of the two securing members S can be disposed on the second engaging plate 4A and the second side plate 13. Therefore, when the first engaging plate 3A is positioned at the first positioning position and the second engaging plate 4A is positioned at the second positioning position, the securing members S can be utilized to fix the first engaging plate 3A and the second engaging plate 4A on the casing structure 1. In addition, the securing members S can also be disposed on the third engaging plate 3B and the third side plate 14, as well as on the fourth engaging plate 4B and the fourth side plate 15, such that the third side plate 14 and the fourth engaging plate 4B are fixed.

Since the waterproof device U of the present disclosure is exemplified as being applied to the signal receiver, the fourth side plate 15 and the fourth engaging plate 4B can each have a hole (not labeled in the figures) formed thereon, and a cable conduit P can be arranged in the holes on the fourth side plate 15 and the fourth engaging plate 4B, respectively, such that cables that are electrically connected to the signal receiver for supplying power can penetrate through the holes. However, the waterproof device U of the present disclosure is not limited to whether or not the holes are formed.

Figure 9:
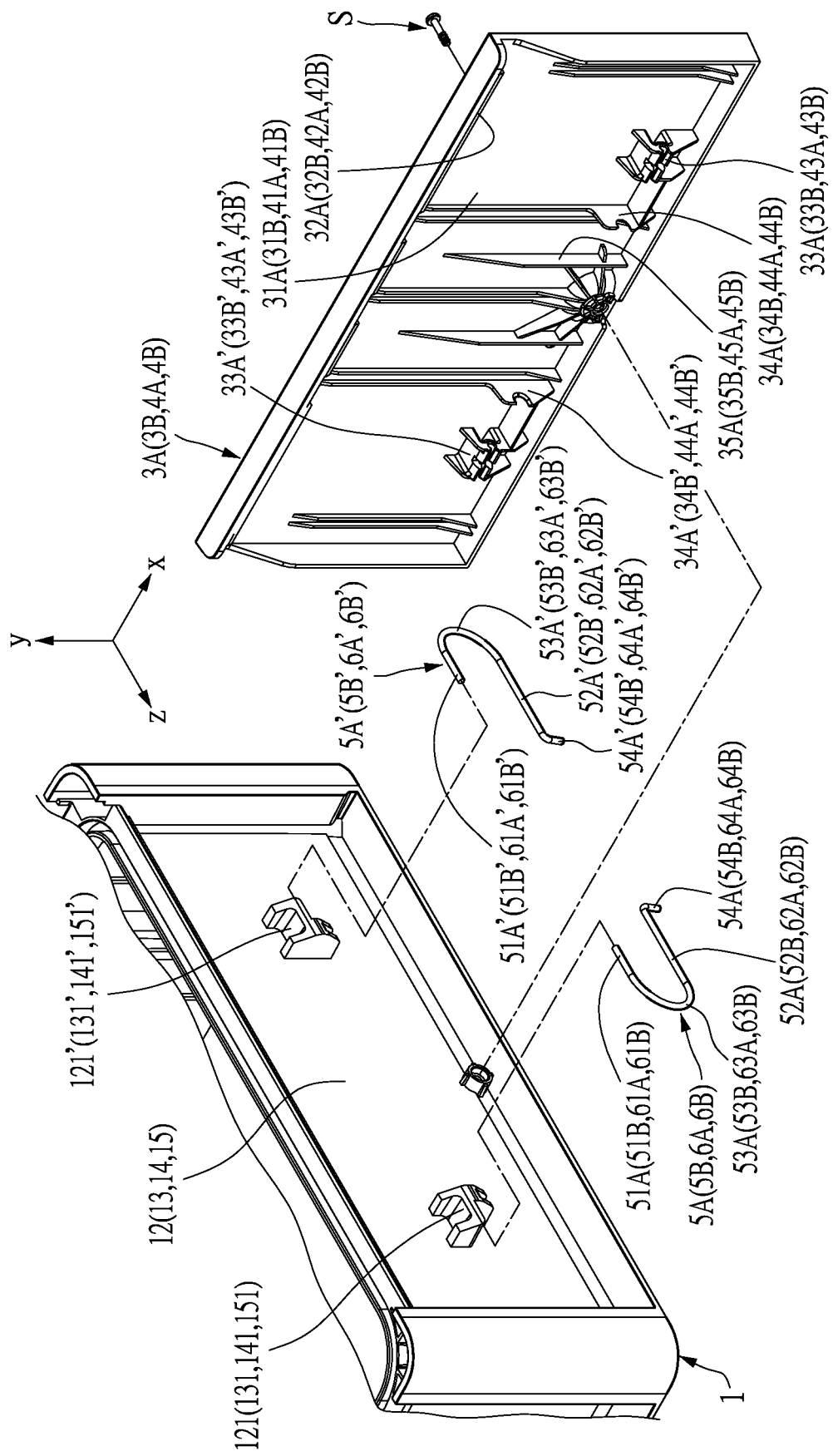
FIG. 9 is a schematic exploded perspective view of a casing structure, a first engaging plate, and a first elastic member of the waterproof device in one embodiment of the present disclosure.
Figure 10:
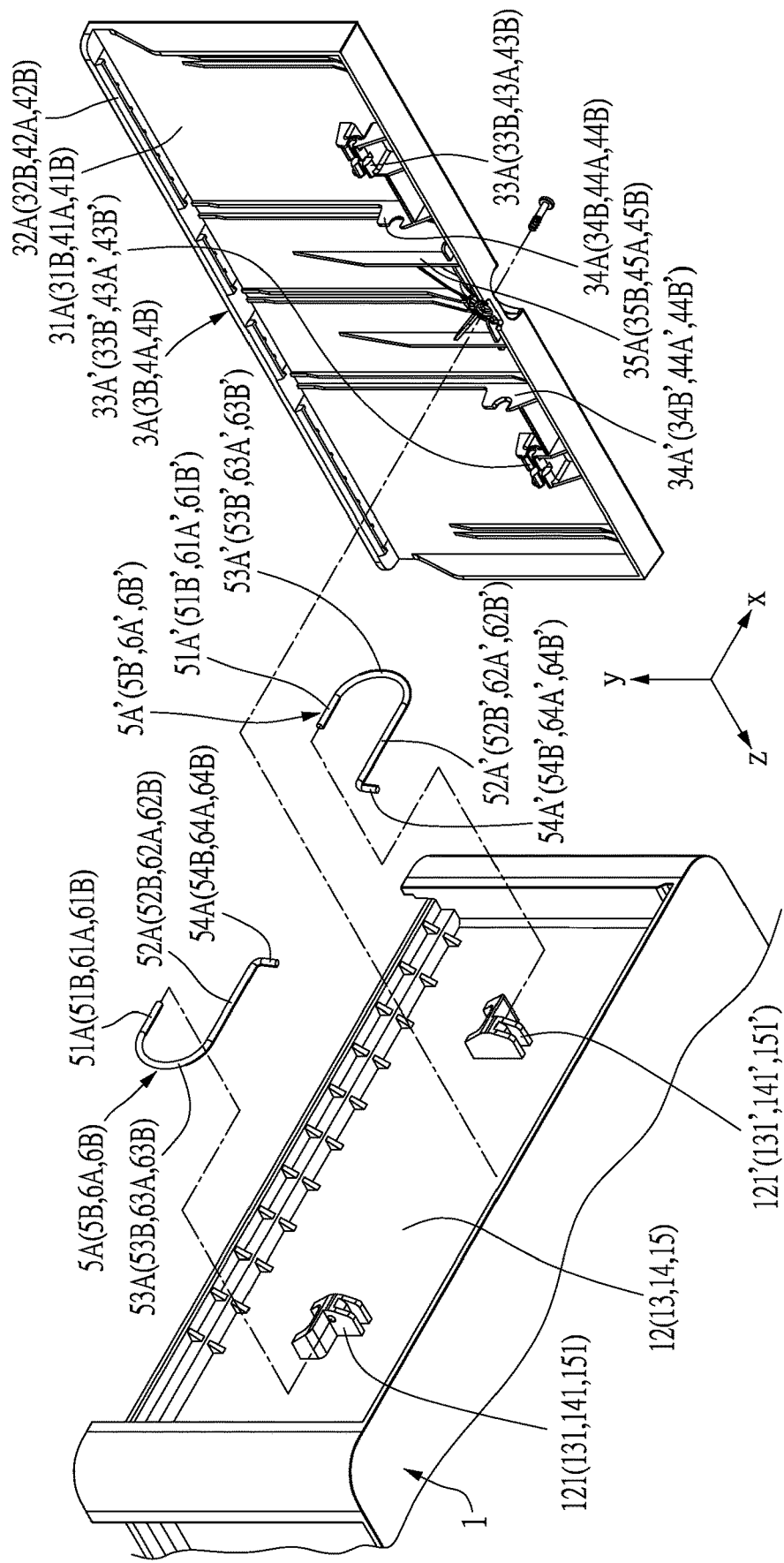
FIG. 10 is another schematic exploded perspective view of the casing structure, the first engaging plate, and the first elastic member of the waterproof device in one embodiment of the present disclosure.
Figure 11:
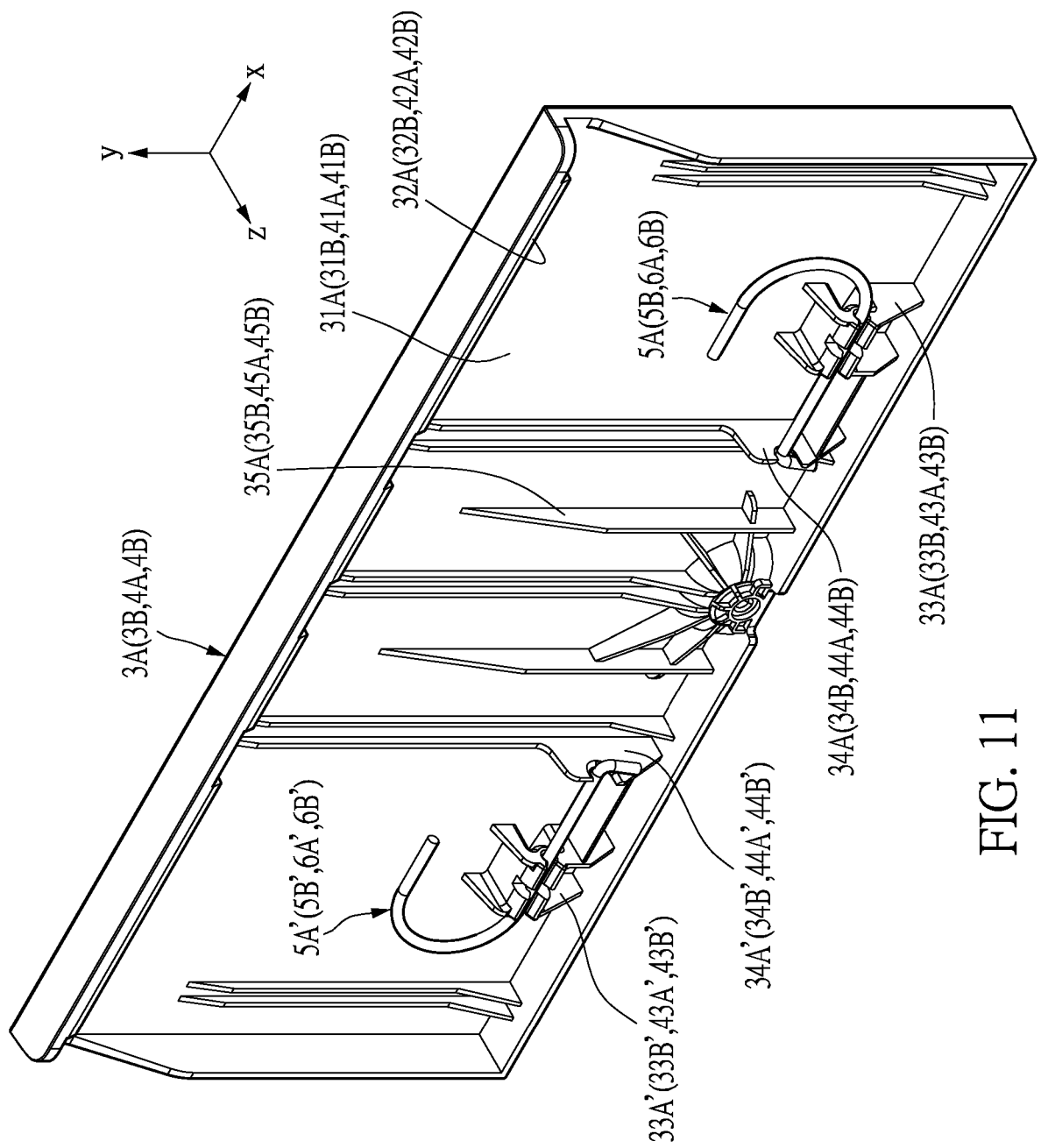
FIG. 11 is a schematic assembled perspective view of the casing structure, the first engaging plate, and the first elastic member of the waterproof device in one embodiment of the present disclosure.

References are further made to FIG. 4 to FIG. 6, and are to be read in conjunction with FIG. 9 to FIG. 11. FIG. 9 and FIG. 10 are schematic exploded perspective views of a casing structure, a first engaging plate, and a first elastic member of the waterproof device in one embodiment of the present disclosure. FIG. 11 is a schematic assembled perspective view of the casing structure, the first engaging plate, and the first elastic member of the waterproof device in one embodiment of the present disclosure. The first engaging plate 3A is disposed adjacent to the first side plate 12, the second engaging plate 4A is disposed adjacent to the second side plate 13 and corresponding to the first engaging plate 3A, the third engaging plate 3B is disposed adjacent to the third side plate 14, and the fourth engaging plate 4B is disposed adjacent to the fourth side plate 15 and corresponding to the third engaging plate 3B. Since structures of the second side plate 13, the third side plate 14, and the fourth side plate 15 are similar to those of the first side plate 12, structures of the second engaging plate 4A, the third engaging plate 3B, and the fourth engaging plate 4B are similar to those of the first engaging plate 3A, and structures of the second elastic member 6A, the third elastic member 5B, and the fourth elastic member 6B are similar to those of the first elastic member 5A, subsequent implementations are mainly exemplified using structures of the first side plate 12, the first engaging plate 3A, and the first elastic member 5A for ease of illustration.

The first engaging plate 3A includes a first plate body 31A, a first fastening portion 32A disposed on the first plate body 31A, and a first retaining groove 33A formed on the first plate body 31A. The first elastic member 5A is connected between the first pivot seat 121 of the first side plate 12 and the first retaining groove 33A of the first engaging plate 3A. In addition, the first elastic member 5A includes a first pivot portion 51A, a second pivot portion 52A, and a first connecting portion 53A connected between the first pivot portion 51A and the second pivot portion 52A. In addition, the first pivot portion 51A is disposed in the first pivot seat 121 on the first side plate 12, and the first pivot portion 51A can rotate relative to the first pivot seat 121, and the second pivot portion 52A is disposed in the first retaining groove 33A of the first engaging plate 3A, and the second pivot portion 52A can rotate relative to the first retaining groove 33A. For example, the first pivot portion 51A and the second pivot portion 52A can be parallel to each other, and the first pivot portion 51A, the second pivot portion 52A, and the first connecting portion 53A may form a shape of the letter "U". However, the present disclosure is not limited thereto.

The first engaging plate 3A can further include a first limiting plate 34A that is disposed on the first plate body 31A, and the first limiting plate 34A is adjacent to the first retaining groove 33A. The first elastic member 5A can further include a first limiting portion 54A. The first limiting portion 54A is connected to the second pivot portion 52A and is arranged in a turning configuration relative to the second pivot portion 52A, and the first limiting portion 54A abuts against the first limiting plate 34A. Therefore, the first elastic member 5A can utilize the first pivot seat 121 to restrict a moving direction (e.g., a negative Z direction) of the first elastic member 5A, and the first elastic member 5A can utilize the first limiting portion 54A to restrict another moving direction (e.g., a positive Z direction) of the first elastic member 5A, so as to position the position of the first elastic member 5A.

The first engaging plate 3A can further include a plurality of first rib structures 35A that are disposed on the first plate body 31A, and a longitudinal direction (e.g., a Y direction) of each of the first rib structures 35A is perpendicular to a longitudinal direction (e.g., a Z direction) of the first plate body 31A. In this way, the strength of the first engaging plate 3A is enhanced by the first rib structures 35A.

The second engaging plate 4A includes a second plate body 41A, a second fastening portion 42A disposed on the second plate body 41A, and a second retaining groove 43A disposed on the second plate body 41A. The second elastic member 6A is connected between the second pivot seat 131 of the second side plate 13 and the second retaining groove 43A of the second engaging plate 4A. The second elastic member 6A includes a third pivot portion 61A, a fourth pivot portion 62A, and a second connecting portion 63A connected between the third pivot portion 61A and the fourth pivot portion 62A. In addition, the third pivot portion 61A is disposed in a second pivot seat 131 on the second side plate 13, and the third pivot portion 61A can rotate relative to the second pivot seat 131, and the fourth pivot portion 62A is disposed in the second retaining groove 43A of the second engaging plate 4A, the fourth pivot portion 62A can rotate relative to the second retaining groove 43A.

The second engaging plate 4A can further include a second limiting plate 44A that is disposed on the second plate body 41A, and the second limiting plate 44A is adjacent to the second retaining groove 43A. The second elastic member 6A can further include a second limiting portion 64A. The second limiting portion 64A is connected to the fourth pivot portion 62A and is arranged in a turning configuration relative to the fourth pivot portion 62A, and the second limiting portion 64A abuts against the second limiting plate 44A. In addition, it should be noted that structures of the second limiting portion 64A and the second limiting plate 44A are similar to those of the first limiting portion 54A and the first limiting plate 34A, and will not be reiterated herein. In addition, the second engaging plate 4A can further include a plurality of second rib structures 45A that are disposed on the second plate body 41A. A longitudinal direction of each of the second rib structures 45A is perpendicular to a longitudinal direction of the second plate body 41A. It should be noted that a purpose of adopting the second rib structures 45A is similar to that of the first rib structures 35A, and will not be reiterated herein.

The third engaging plate 3B includes a third plate body 31B, a third fastening portion 32B disposed on the third plate body 31B, and a third retaining groove 33B disposed on the third plate body 31B. The third elastic member 5B is connected between the third pivot seat 141 of the third side plate 14 and the third retaining groove 33B of the third engaging plate 3B. The third elastic member 5B includes a fifth pivot portion 51B, a sixth pivot portion 52B, and a third connecting portion 53B connected between the fifth pivot portion 51B and the sixth pivot portion 52B. In addition, the fifth pivot portion 51B is disposed in a third pivot seat 141 on the third side plate 14, and the fifth pivot portion 51B can rotate relative to the third pivot seat 141. The sixth pivot portion 52B is disposed in the third retaining groove 33B of the third engaging plate 3B, and the sixth pivot portion 52B can rotate relative to the third retaining groove 33B.

The fourth engaging plate 4B includes a fourth plate body 41B, a fourth fastening portion 42B disposed on the fourth plate body 41B, and a fourth retaining groove 43B disposed on the fourth plate body 41B. The fourth elastic member 6B is connected between the fourth pivot seat 151 of the fourth side plate 15 and the fourth retaining groove 43B of the fourth engaging plate 4B. The fourth elastic member 6B includes a seventh pivot portion 61B, an eighth pivot portion 62B, and a fourth connecting portion 63B connected between the seventh pivot portion 61B and the eighth pivot portion 62B. In addition, the seventh pivot portion 61B is disposed in a fourth pivot seat 151 on the fourth side plate 15, and the seventh pivot portion 61B can rotate relative to the fourth pivot seat 151. The eighth pivot portion 62B is disposed in the fourth retaining groove 43B of the fourth engaging plate 4B, and the eighth pivot portion 62B can rotate relative to the fourth retaining groove 43B.

The third engaging plate 3B can further include a third limiting plate 34B disposed on the third plate body 31B and a plurality of third rib structures 35B disposed on the third plate body 31B, and the third elastic member 5B can further include a third limiting portion 54B. In addition, the fourth engaging plate 4B can further include a fourth limiting plate 44B disposed on the fourth plate body 41B and a plurality of fourth rib structures 45B disposed on the fourth plate body 41B, and the fourth elastic member 6B can further include a fourth limiting portion 64B. It should be noted that structures of the third limiting plate 34B, the third limiting portion 54B, the third rib structures 35B, the fourth limiting plate 44B, the fourth limiting portion 64B, and the fourth rib structures 45B are similar to those of the first limiting plate 34A, the first limiting portion 54A, and the first rib structures 35A, and will not be reiterated herein.

References are further made to FIG. 4 to FIG. 11, the waterproof device U can further include another first elastic member 5A' and another second elastic member 6A'. The another first elastic member 5A' is provided corresponding to the first elastic member 5A, and the another first elastic member 5A' is connected between the first side plate 12 and the first engaging plate 3A. The another second elastic member 6A' is disposed corresponding to the second elastic member 6A, and the another second elastic member 6A' is connected between the second side plate 13 and the second engaging plate 4A. That is, the first elastic member 5A and the another first elastic member 5A' are symmetrically arranged between the first side plate 12 and the first engaging plate 3A, and the second elastic member 6A and the another second elastic member 6A' are symmetrically arranged between the second side plate 13 and the second engaging plate 4A. In this way, the another first elastic member 5A' and the another second elastic member 6A' can increase elasticities of the first engaging plate 3A and the second engaging plate 4A engaging with the cover structure 2 and the casing structure 1.

The another first elastic member 5A' includes a first pivot portion 51A', a second pivot portion 52A', a first connecting portion 53A' connected between the first pivot portion 51A' and the second pivot portion 52A', and a first limiting portion 54A' connected to the second pivot portion 52A'. The first pivot portion 51A' of the another first elastic member 5A' is disposed in another first pivot seat 121' on the first side plate 12, and the first pivot portion 51A' of the another first elastic member 5A' can rotate relative to the another first pivot seat 121'. The second pivot portion 52A' of the another first elastic member 5A' is disposed in another first retaining groove 33A' of the first engaging plate 3A, the second pivot portion 52A' of the another first elastic member 5A' can rotate relative to the another first retaining groove 33A', and the first limiting portion 54A' of the another first elastic member 5A' can abut against a first limiting plate 34A'. The another second elastic member 6A' includes a third pivot portion 61A', a fourth pivot portion 62A', a second connecting portion 63A' connected between the third pivot portion 61A' and the fourth pivot portion 62A', and a second limiting portion 64A' connected to the fourth pivot portion 62A'. The third pivot portion 61A' of the another second elastic member 6A' is disposed in another second pivot seat 131' on the second side plate 13, and the third pivot portion 61A' of the another second elastic member 6A' can rotate relative to the another second pivot seat 131'. The fourth pivot portion 62A' of the another second elastic member 6A' is disposed in another second retaining groove 43A' of the second engaging plate 4A, the fourth pivot portion 62A' of the another second elastic member 6A' can rotate relative to the another second retaining groove 43A', and the second limiting portion 64A' of the another second elastic member 6A' can abut against a second limiting plate 44A'. In addition, structures of the another first elastic member 5A' and the another second elastic member 6A' are similar to those of the first elastic member 5A and the second elastic member 6A, and will not be reiterated herein.

The waterproof device U can further include another third elastic member 5B' and another fourth elastic member 6B'. The another third elastic member 5B' is disposed corresponding to the third elastic member 5B, and the another third elastic member 5B' is connected between another third pivot seat 141' of the third side plate 14 and another third retaining groove 33B' of the third engaging plate 3B. The another fourth elastic member 6B' is disposed corresponding to the fourth elastic member 6B, and the another fourth elastic member 6B' is connected between another fourth pivot seat 151' of the fourth side plate 15 and another fourth retaining groove 43B' of the fourth engaging plate 4B. In addition, the another third elastic member 5B' includes a fifth pivot portion 51B', a sixth pivot portion 52B', a third connecting portion 53B' connected between the fifth pivot portion 51B' and the sixth pivot portion 52B', and a third limiting portion 54B' connected to the sixth pivot portion 52B'. The third limiting portion 54B' can abut against the third limiting plate 34B'. In addition, the another fourth elastic member 6B' includes a seventh pivot portion 61B', an eighth pivot portion 62B', a fourth connecting portion 63B' connected between the seventh pivot portion 61B' and the eighth pivot portion 62B', and a fourth limiting portion 64B' connected to the eighth pivot portion 62B'. The fourth limiting portion 64B' can abut against a fourth limiting plate 44B'. In addition, it should be noted that structures of the another third elastic member 5B' and the another fourth elastic member 6B' are similar to those of the third elastic member 5B and the fourth elastic member 6B, and will not be reiterated herein.

Figure 12:
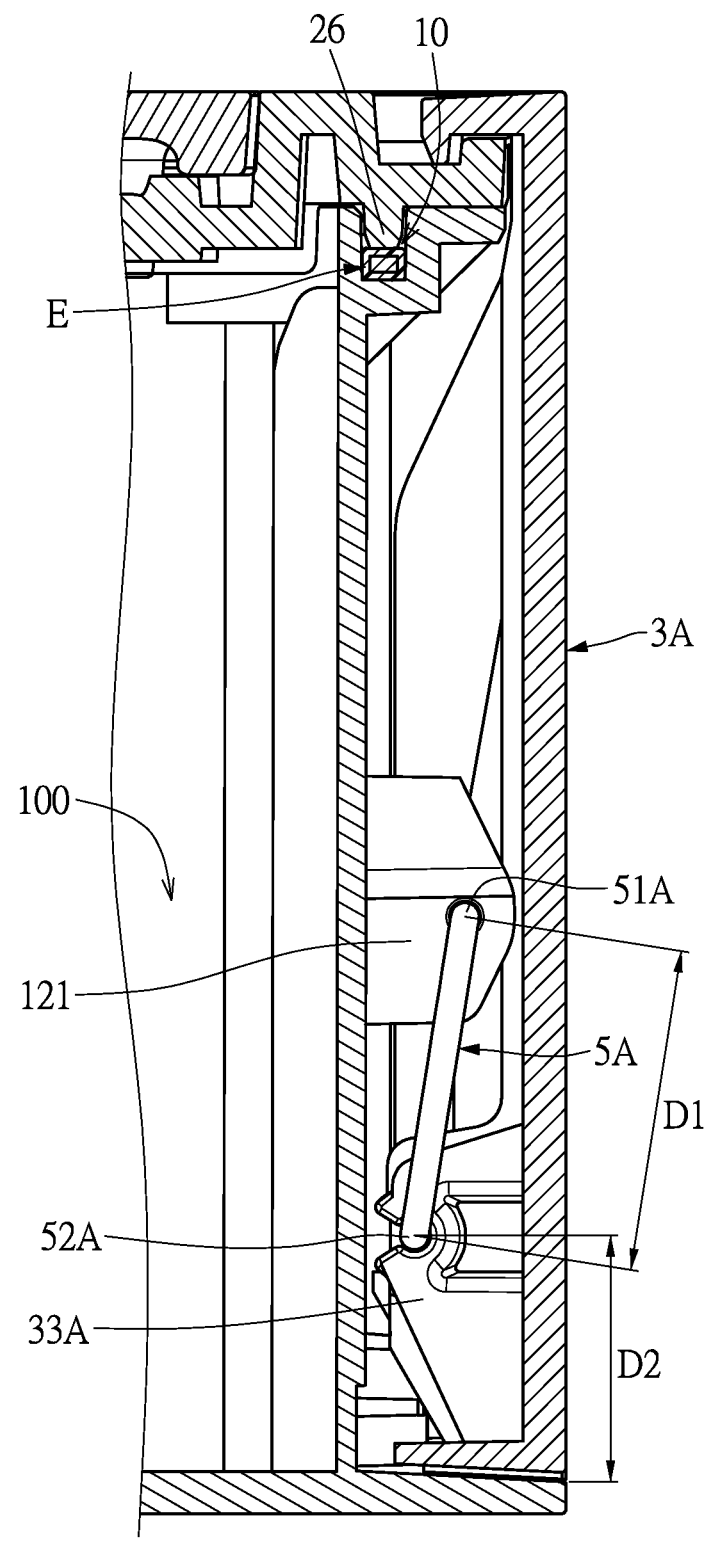
FIG. 12 is a cross-sectional view taken along line XII-XII of FIG. 3.

Referring to FIG. 12, FIG. 12 is a cross-sectional view taken along line XII-XII of FIG. 3. When the first engaging plate 3A is positioned at the first positioning position, the second pivot portion 52A of the first elastic member 5A is closer to the accommodating space 100 than the first pivot portion 51A. That is to say, the first elastic member 5A is inclined to provide an elastic force for the first engaging plate 3A to be engaged to the cover structure 2. In addition, the second elastic member 6A, the third elastic member 5B, and the fourth elastic member 6B also have a similar function, which will not be reiterated herein.

In addition, a first predetermined distance D1 is between the first pivot portion 51A and the second pivot portion 52A of the first elastic member 5A. A second predetermined distance D2 is between a bottom side (not labeled in the figures) of the first engaging plate 3A that is adjacent to the bottom plate 11 and the second pivot portion 52A. The first predetermined distance D1 is greater than the second predetermined distance D2. Therefore, the first engaging plate 3A can be moved to the first disengagement position as shown in FIG. 7, and configuring the first elastic member 5A between the first engaging plate 3A and the first side plate 12 can be more convenient.

Figure 13:
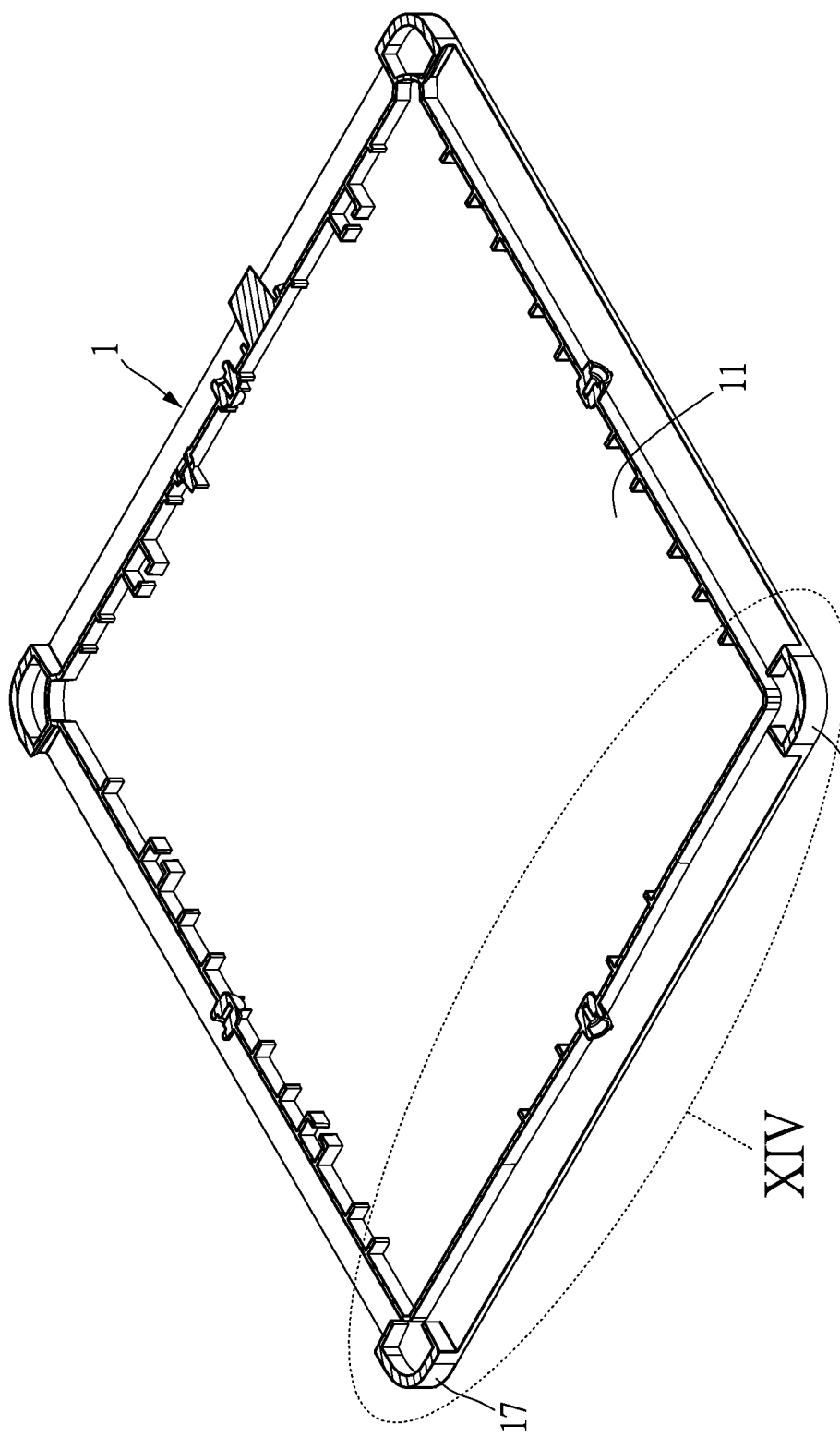
FIG. 13 is a cross-sectional view taken along line XIII-XIII of FIG. 4.
Figure 14:
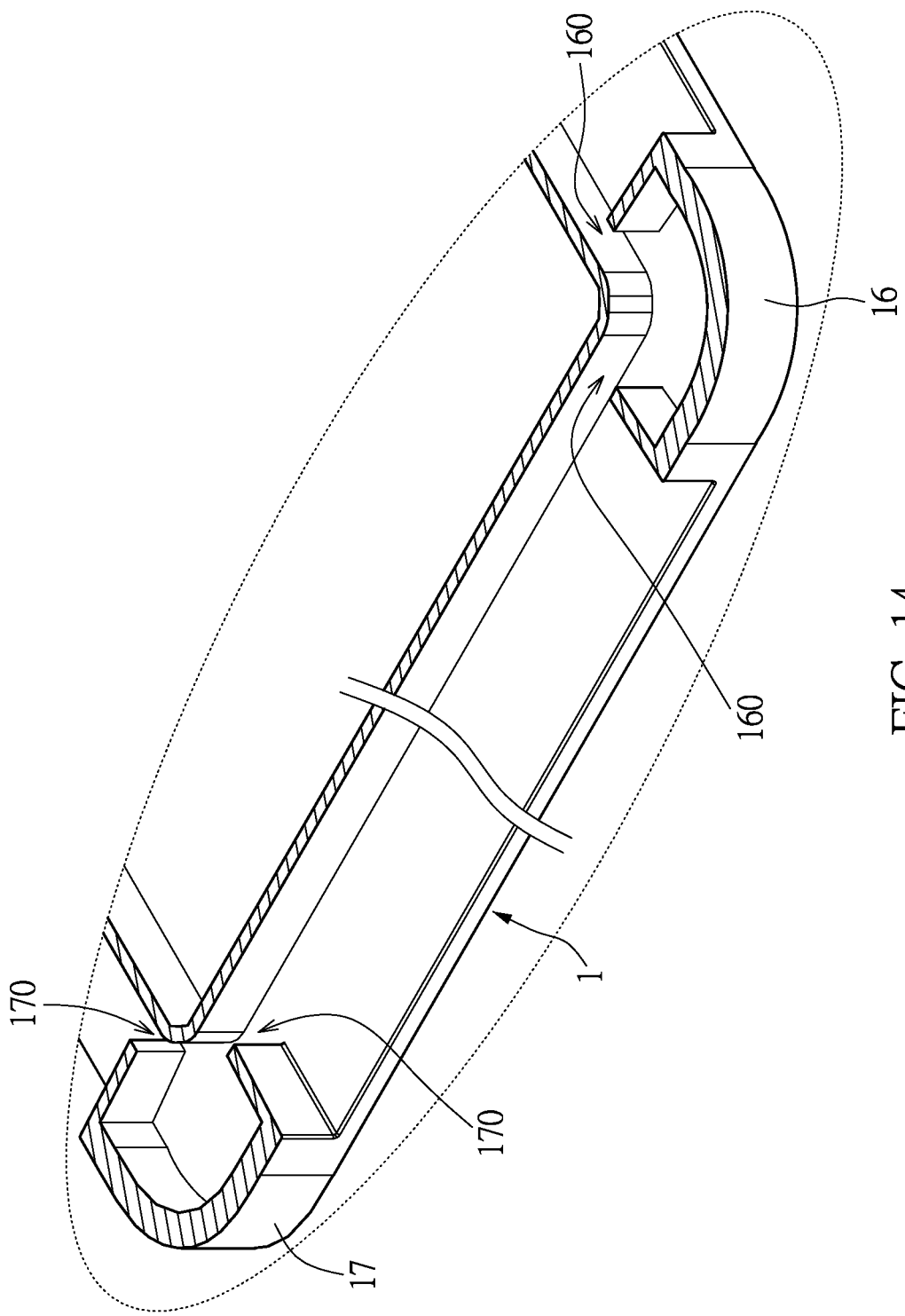
FIG. 14 shows a partial enlarged view of part XIV of FIG. 13.

Reference is further made to FIG. 1, and is to be read in conjunction with FIG. 13 and FIG. 14. FIG. 13 is a cross-sectional view taken along line XIII-XIII of FIG. 4. FIG. 14 shows a partial enlarged view of part XIV of FIG. 13. The casing structure 1 can further include a first connecting frame 16 and a second connecting frame 17. The first connecting frame 16 is disposed between the first side plate 12 and the third side plate 14, and the second connecting frame 17 is disposed between the second side plate 13 and the third side plate 14. The first connecting frame 16 includes at least one first drain hole 160, and the second connecting frame 17 includes at least one second drain hole 170. In addition, a space between the third engaging plate 3B and the third side plate 14 can be communicated with a space between the first engaging plate 3A and the first side plate 12 through the at least one first drain hole 160, and a space between the third engaging plate 3B and the third side plate 14 can be communicated with a space between the second engaging plate 4A and the second side plate 13 through the at least one second drain hole 170. Therefore, when liquid (e.g., rainwater) flows into the space between the third engaging plate 3B and the third side plate 14, the at least one first drain hole 160 and the at least one second drain hole 170 can respectively introduce the liquid to the space between the first engaging plate 3A and the first side plate 12, and the space between the second engaging plate 4A and the second side plate 13. Next, the liquid can be discharged through a gap between the first engaging plate 3A and the first side plate 12 and a gap between the second engaging plate 4A and the second side plate 13.

Beneficial Effects of the Embodiment

One of the beneficial effects of the waterproof device U provided by the present disclosure is that, the waterproofing effect of the waterproof device U can be enhanced through technical solutions of "the first engaging plate 3A being capable of reciprocating between the first positioning position and the first disengagement position relative to the first side plate 12, and the second engaging plate 4A being capable of reciprocating between the second positioning position and the second disengagement position relative to the second side plate 13" and "when the first engaging plate 3A is positioned at the first positioning position, the first fastening portion 32A being fastened on the first abutting portion 22, and when the second engaging plate 4A is positioned at the second positioning position, the second fastening portion 42A being fastened on the second abutting portion 23".

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A waterproof device, comprising:
    a casing structure including a bottom plate, and a first side plate, a second side plate, a third side plate, and a fourth side plate surrounding a periphery of the bottom plate and connected to the bottom plate, wherein the third side plate is connected between the first side plate and the second side plate, the fourth side plate is connected between the first side plate and the second side plate, and the bottom plate, the first side plate, the second side plate, the third side plate, and the fourth side plate surroundingly and jointly form an accommodating space;
    a cover structure disposed on the casing structure and covering the accommodating space, the cover structure abutting against the first side plate, the second side plate, the third side plate, and the fourth side plate, wherein the cover structure includes a cover body, and a first abutting portion and a second abutting portion that are disposed on the cover body;
    a first engaging plate disposed adjacent to the first side plate, the first engaging plate including a first plate body, a first fastening portion disposed on the first plate body, and a first retaining groove formed on the first plate body;
    a second engaging plate disposed adjacent to the second side plate and corresponding to the first engaging plate, the second engaging plate including a second plate body, a second fastening portion disposed on the second plate body, and a second retaining groove formed on the second plate body;
    a first elastic member connected between the first side plate and the first engaging plate, the first elastic member including a first pivot portion, a second pivot portion, and a first connecting portion connected between the first pivot portion and the second pivot portion, the first pivot portion being disposed in a first pivot seat on the first side plate, and the second pivot portion being disposed in the first retaining groove of the first engaging plate, wherein the first pivot portion is rotatable relative to the first pivot seat, and the second pivot portion is rotatable relative to the first retaining groove; and
    a second elastic member connected between the second side plate and the second engaging plate, the second elastic member including a third pivot portion, a fourth pivot portion, and a second connecting portion connected between the third pivot portion and the fourth pivot portion, the third pivot portion being disposed in a second pivot seat on the second side plate, and the fourth pivot portion being disposed in the second retaining groove of the second engaging plate, wherein the third pivot portion is rotatable relative to the second pivot seat, and the fourth pivot portion is rotatable relative to the second retaining groove;
    wherein the first engaging plate is capable of reciprocating between a first positioning position and a first disengagement position relative to the first side plate, and the second engaging plate is capable of reciprocating between a second positioning position and a second disengagement position relative to the second side plate;
    wherein, when the first engaging plate is positioned on the first positioning position, the first fastening portion is fastened on the first abutting portion; when the second engaging plate is positioned on the second positioning position, the second fastening portion is fastened on the second abutting portion.

2. The waterproof device according to claim 1, further comprising a cushion ring disposed between the casing structure and the cover structure, the cushion ring surrounding the accommodating space, wherein, when the first engaging plate is positioned at the first positioning position and the second engaging plate is positioned at the second positioning position, the cushion ring tightly abuts against the casing structure and the cover structure, so as to seal the accommodating space.

3. The waterproof device according to claim 1, further comprising another first elastic member and another second elastic member, wherein the another first elastic member is disposed corresponding to the first elastic member, the another first elastic member is connected between the first side plate and the first engaging plate, the another second elastic member is disposed corresponding to the second elastic member, and the another second elastic member is connected between the second side plate and the second engaging plate; wherein the another first elastic member includes a first pivot portion, a second pivot portion, and a first connecting portion connected between the first pivot portion and the second pivot portion, the first pivot portion of the another first elastic member is disposed in another first pivot seat on the first side plate, and the second pivot portion of the another first elastic portion is disposed in another first retaining groove of the first engaging plate, wherein the first pivot portion of the another first elastic member is rotatable relative to the another first pivot seat, and the second pivot portion of the another first elastic member is rotatable relative to the another first retaining groove; wherein the another second elastic member includes a third pivot portion, a fourth pivot portion, and a second connecting portion connected between the third pivot portion and the fourth pivot portion, the third pivot portion of the another second elastic member is disposed in another second pivot seat on the second side plate, and the fourth pivot portion of the another second elastic member is disposed in another second retaining groove of the second engaging plate, wherein the third pivot portion of the another second elastic member is rotatable relative to the another second pivot seat, and the fourth pivot portion of the another second elastic member is rotatable relative to the another second retaining groove.

4. The waterproof device according to claim 1, further comprising a plurality of securing members, one of the securing members being disposed on the first engaging plate and the first side plate, and another one of the securing members being disposed on the second engaging plate and the second side plate.

5. The waterproof device according to claim 1, further comprising a third engaging plate, a fourth engaging plate, a third elastic member, and a fourth elastic member; wherein the third engaging plate is disposed adjacent to the third side plate, and the third engaging plate includes a third plate body, a third fastening portion fastened on the third plate body, and a third retaining groove formed on the third plate body; wherein the fourth engaging plate is disposed adjacent to the fourth side plate, and the fourth engaging plate includes a fourth plate body, a fourth fastening portion fastened on the fourth plate body, and a fourth retaining groove formed on the fourth plate body; wherein the third elastic member is connected between the third side plate and the third engaging plate, and the third elastic member includes a fifth pivot portion, a sixth pivot portion, and a third connecting portion connected between the fifth pivot portion and the sixth pivot portion, the fifth pivot portion is disposed in a third pivot seat on the third side plate, and the fifth pivot portion is rotatable relative to the third pivot seat, the sixth pivot portion is disposed in the third retaining groove of the third engaging plate, and the sixth pivot portion is rotatable relative to the third retaining groove; wherein the fourth elastic member includes a seventh pivot portion, an eighth pivot portion, and a fourth connecting portion connected between the seventh pivot portion and the eighth pivot portion, and the seventh pivot portion is disposed in a fourth pivot seat on the fourth side plate, the seventh pivot portion is rotatable relative to the fourth pivot seat, the eighth pivot portion is disposed in the fourth retaining groove of the fourth engaging plate, and the eighth pivot portion is rotatable relative to the fourth retaining groove.

6. The waterproof device according to claim 5, wherein the casing structure further includes a first connecting frame and a second connecting frame, the first connecting frame is disposed between the first side plate and the third side plate, and the second connecting frame is disposed between the second side plate and the third side plate, wherein the first connecting frame includes at least one first drain hole, and the second connecting frame includes at least one second drain hole.

7. The waterproof device according to claim 1, wherein the first engaging plate further includes a first limiting plate disposed on the first plate body, and the first limiting plate is adjacent to the first retaining groove; wherein the second engaging plate further includes a second limiting plate disposed on the second plate body, and the second limiting plate is adjacent to the second retaining groove; wherein the first elastic member further includes a first limiting portion, the first limiting portion is connected to and is arranged in a turning configuration relative to the second pivot portion, and the first limiting portion abuts against the first limiting plate; wherein the second elastic member further includes a second limiting portion, the second limiting portion is connected to and is arranged in a turning configuration relative to the fourth pivot portion, and the second limiting portion abuts against the second limiting plate.

8. The waterproof device according to claim 1, wherein the first engaging plate further includes a plurality of first rib structures disposed on the first plate body, and a longitudinal direction of each of the first rib structures is perpendicular to a longitudinal direction of the first plate body; wherein the second engaging plate further includes a plurality of second rib structures disposed on the second plate body, and a longitudinal direction of each of the second rib structures is perpendicular to a longitudinal direction of the second plate body.

9. The waterproof device according to claim 1, wherein a first predetermined distance is between the first pivot portion and the second pivot portion, a second predetermined distance is between a bottom side of the first engaging plate adjacent to the bottom plate and the second pivot portion, and the first predetermined distance is greater than the second predetermined distance.

10. The waterproof device according to claim 1, wherein, when the first engaging plate is positioned at the first positioning position, the second pivot portion is closer to the accommodating space than the first pivot portion.

* * * * *